United States Patent [19]

Gobara et al.

[11] Patent Number: 4,504,795
[45] Date of Patent: Mar. 12, 1985

[54] IMPEDANCE CONVERSION CIRCUIT USING FETS

[75] Inventors: Taku Gobara; Hirozumi Misaki, both of Takatsuki, Japan

[73] Assignee: Matsushita Electronics Corporation, Kadoma, Japan

[21] Appl. No.: 409,346

[22] Filed: Aug. 18, 1982

[30] Foreign Application Priority Data Apr. 28, 1981 [JP] Japan .................................. 56-64892

[51] Int. Cl.³ .............................................. H03F 3/16
[52] U.S. Cl. .................................... 330/277; 330/311
[58] Field of Search ................ 330/277, 310, 311, 300

[56] References Cited

PUBLICATIONS

Ahmed, "Zero-Offset Potential Follower Circuits", RCA Technical Notes, TN No. 938, Sep. 17, 1973.

Primary Examiner—James B. Mullins
Attorney, Agent, or Firm—Cushman, Darby & Cushman

[57] ABSTRACT

An impedance conversion circuit wherein source-follower circuits are formed at the input side and at the output side, between the first source-follower circuit (input side) and the second source-follower circuit (output side), a signal transmission circuit is constructed by connecting two FETs. In this circuit the threshold voltages of the FETs and variation of the threshold voltages can be offset, whereby the output voltage becomes equal to the imput voltage regardless of fluctuations of the threshold voltage or temperature, thereby retaining the voltage constant during impedance conversion from a high input impedance to a low output impedance.

7 Claims, 3 Drawing Figures

F I G. 3
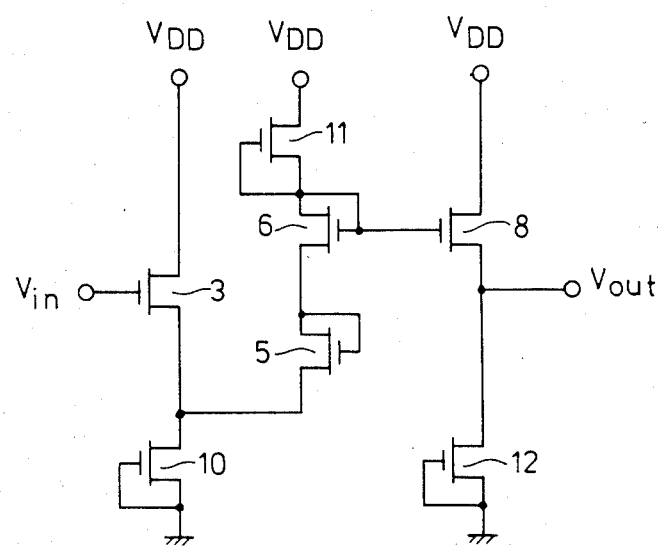

IMPEDANCE CONVERSION CIRCUIT USING FETS

BACKGROUND OF THE INVENTION

1. Field of the Invention

The present invention relates to an impedance conversion circuit which can attain a stable and superior transfer characteristic between input and output by using FETs (field-effect transistors).

2. Prior Art

When an input signal is to be transferred with the impedance converted, it is desirable to use an amplifier such as a source-follower circuit using FET(s).

However, as to the source-follower circuit using FET(s), the output voltage is not equal to the input voltage, since the output voltage depends on the threshold voltage ($V_T$) of the FET used in the source-follower circuit. That is, in the source-follower circuit, the output voltage $V_{out}$ is given as:

$$V_{out} \approx V_{in} - V_T$$

wherein, $V_{in}$ is the input voltage to the source-follower circuit. This means that there is a certain difference ($V_T$) between the output voltage and the input voltage, further there is a defect in that the transfer characteristic between the input and the output voltage is unstable or fluctuates since the threshold voltage $V_T$ depends on the structure and production process of FET(s) or depends on temperature. Above all, the threshold voltage $V_T$ of a MOS-FET, which is typical for an insulated gate FET, depends largely on the production process, therefore, for the purpose of making the input/output characteristic of the source-follower circuit stable and constant the production process must be controlled accurately. Thus, obtaining stable and even input/output characteristics is very difficult.

The prior art will now be explained in greater detail as follows:

An exemplary conventional impedance conversion circuit is shown in FIG. 1. The circuit of FIG. 1 is a widely used fundamental source-follower circuit usually using a MOS-FET as the FET.

The operation of the circuit of FIG. 1, wherein the MOS-FET is used as FET 1, is explained as follows:

Provided that $V_T$ is the threshold voltage of MOS-FET 1, $V_{in}$ is the input voltage, $V_{out}$ is the output voltage, and the output impedance of MOS-FET 1 is sufficiently smaller than the impedance of the load resistance 2, then the output voltage $V_{out}$ is generally given as:

$$V_{out} \approx V_{in} - V_T \tag{1}$$

However, when the circuit in FIG. 1 is integrated in a semiconductor substrate, it is known that the threshold voltage $V_T$ varies on account of, what is called, the effect of substrate bias (body effect). Therefore, the threshold voltage is expressed as ($V_T + \Delta V_T$). Accordingly, the output voltage $V_{out}$ is given as:

$$V_{out} = V_{in} - (V_T + \Delta V_T) \tag{2},$$

wherein, $\Delta V_T$ is the variation of the threshold voltage $V_T$. Referring to the formula, it is obvious that the output voltage $V_{out}$ of the of FIG. 1 decreases by the amount of the sum of $V_T$ and $\Delta V_T$ from $V_{in}$. The variation $\Delta V_T$ depends on the output voltage $V_{out}$ itself. Accordingly, the variation is not constant.

In addition, when using a MOS-FET, the threshold level voltage $V_T$ and the variation $\Delta V_T$ varies largely depending on the production process used and etc. Therefore, the stability of the threshold voltage $V_T$ and variation $\Delta V_T$ requires a high level of control over the production process. Further, $V_T$ and $\Delta V_T$ depend on temperature and accordingly to make $V_T$ and $\Delta V_T$ constant in the actual circuit is very difficult. Therefore, the circuit shown in FIG. 1 is extremely inappropriate for the purpose of realizing a stable and superior transfer characteristic.

SUMMARY OF THE INVENTION

The present invention purports to offer an impedance conversion circuit wherein, firstly, the input-output characteristic is independent from threshold voltage by using FETS, and secondly, the characteristic is that $V_{out}$ is equal to $V_{in}$, by using an improved source-follower circuit. Briefly the circuit which realizes the above purposes comprises a first source-follower circuit formed by connecting a load resistance (4) to the source electrode of a first FET (3), wherein the gate electrode is connected to receive an input signal, and the source electrode of a second FET (5) is connected to the output terminal A of the said first source-follower circuit, the gate electrode and the drain electrode of the second FET (5) being connected in common, the source electrode of a third FET (6) is connected to a common connected point B, the gate electrode and drain electrode of the third FET (6) being connected in common forming a node or a second common connected point C which is connected to the gate electrode of a fourth FET (8), and at the same time the point C is connected to a power source terminal $V_{DD}$ through a load resistance (7), and said fourth FET (8) and a load resistance (9), connected to the source of the fourth FET (8), form a second source-follower circuit for issuing an output signal therefrom. The impedance conversion circuit, composed as described above, allows a satisfactory input/output characteristic to be obtainable, such that $V_{in}$ is equal to $V_{out}$, and further more, the circuit is able to maintain such a function in that the input impedance is high and the output impedance is low, this function being the specific characteristic of an impedance conversion circuit composed of a source-follower circuit.

BRIEF EXPLANATION OF THE DRAWING

FIG. 3 is a circuit diagram of another impedance conversion circuit using MOS-FETs, wherein all of the circuit elements are formed by MOS-FETs embodying the present invention.

DESCRIPTION OF THE PREFERRED EMBODIMENT

The impedance conversion circuit comprising:

a first source-follower circuit comprising a first FET, the gate electrode receiving an input signal, and a load resistance connected to the source electrode of said first FET, a second FET connected by the source electrode to the output terminal of the first source-follower circuit, a first common connected point being made by connecting the gate electrode and the drain electrode of the second FET, a third FET connected by the source electrode to the first common connected point, a second common connected point being made of connecting the gate electrode and the drain electrode of the third FET and said second common connected point being connected to a power source through a load resistance, a second source-follower circuit comprising a fourth FET and a load resistance, the fourth FET being connected by the gate electrode to the second common connected point, by the source electrode to the load resistance, the second source-follower circuit being used for issuing an output signal therefrom.

Figure 1:
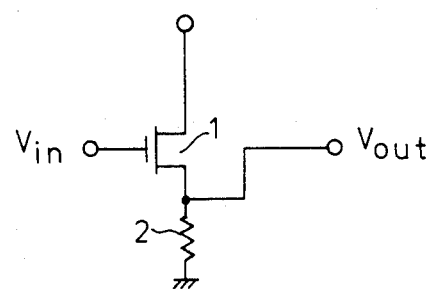
FIG. 1 is the circuit diagram showing an example of a conventional impedance conversion circuit of a source-follower circuit using a MOS-FET.
Figure 2:
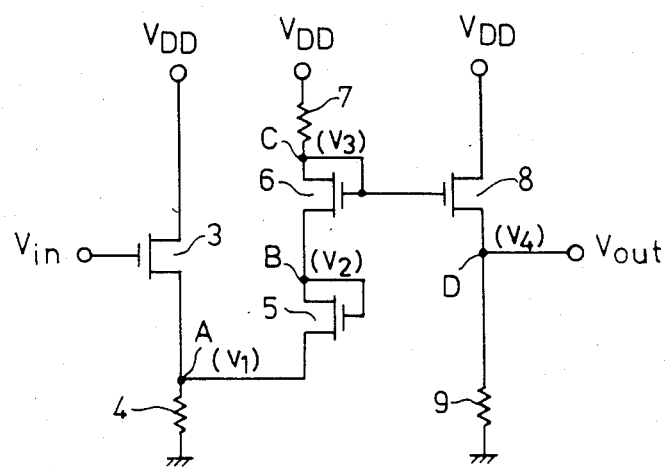
FIG. 2 is an exemplary circuit diagram of an impedance conversion circuit using MOS-FETs, embodying the present invention.

The impedance conversion circuit using an enhancement MOS·FET is shown in FIG. 2 as an embodiment of the present invention. Input voltage $V_{in}$ is applied to the first source-follower circuit composed of MOS·FET 3 and a resistance 4. The source electrode of a MOS·FET 5 is connected to the output terminal A of the first source-follower circuit. The gate electrode and drain electrode of the MOS·FET 5 are connected in common to form a first common-connected point B which is connected to the source electrode of a MOS·FET 6. The gate electrode and the drain electrode of the MOS·FET 6 are connected in common to form a second common connected point C which is connected to a power source terminal through a resistance 7. Also, the node of the second common connected point C of the MOS·FET 6 is applied to the input terminal of the second source-follower circuit composed of a MOS·FET 8 and a resistance 9. That is, the signal is applied to the gate electrode of the MOS·FET 8, and from the output terminal of the second source-follower circuit, that is the source of the fourth FET 8, the output signal voltage $V_{out}$ is taken out.

The inventors investigated the relationship between the input voltage $V_{in}$ and the output voltage $V_{out}$, for the impedance conversion circuit shown in FIG. 2, wherein $V_{T1}$, $V_{T2}$, $V_{T3}$ and $V_{T4}$ respectively represent the threshold voltages of the MOS·FETs 3, 5, 6 and 8, which are the main elements of the impedance conversion circuit, and $\Delta V_{T1}$, $\Delta V_{T2}$, $\Delta V_{T3}$ and $\Delta V_{T4}$ respectively represent the variation of the threshold voltage $V_{T1}$, $V_{T2}$, $V_{T3}$ and $V_{T4}$. The variations are produced on account of the aforementioned body effect, and $V_1$ is the source electric potential of the MOS·FET 3, $V_2$ is the drain electric potential of the MOS·FET 5, $V_3$ is the drain electric potential of the MOS·FET 6, $V_4$ is the source electric potential of the MOS·FET 8, wherein the values $V_1$, $V_2$, $V_3$ and $V_4$ are the electric potentials of the nodes between the input terminal and the output terminal of the impedance conversion circuit shown in FIG. 2.

In this case, resistances 4, 7 and 9 are sufficiently large in comparison with corresponding output impedances of the MOS·FET 3, 6 and 8, respectively, which are active elements. And for the stability of operation the volume $R_1$ of the resistance 4 and the volume $R_2$ of the resistance 7 should satisfy the relation as: $R_1 < R_2$.

First, the source electric potential $V_1$ of the MOS·FET 3 is given as:

$$V_1 \approx V_{in} - (V_{T1} + \Delta V_{T1}) \tag{3}$$

The formula (3) is the same as the equation (2) for a conventional source-follower circuit. And, the drain electric potential $V_2$ of the MOS·FET 5 is expressed as the sum of the node electric potential $V_1$, which is given by formula (3), and the relation of the threshold voltage $V_{T2}$ and the variation $\Delta V_{T2}$ of MOS·FET 5, namely, the drain electric potential $V_2$ of the MOS·FET 5 is given as:

$$V_2 = \{V_{in} - (V_{T1} + \Delta V_{T1})\} + (V_{T2} + \Delta V_{T2}) \tag{4}$$

Now, when the MOS·FET 3, 5 are formed on the same semiconductor substrate, $V_{T1}$ is equal to $V_{T2}$, which are the threshold voltages, and each source potential of the MOS·FET 3 and the MOS·FET 5 is the same $V_1$ as shown at the formula (4), thereby the variation $\Delta V_{T1}$, is equal to the variation $\Delta V_{T2}$. Therefore, the drain electric potential $V_2$ of the MOS·FET 5, which is expressed in the formula (4), is equal to the input voltage $V_{in}$. That is, $V_2$ is given by:

$$V_2 = V_{in} \tag{5}$$

Next, like in the case of equation (4), the drain potential $V_3$ of the MOS·FET 6 is given as $$V_3 = V_2 + (V_{T3} + \Delta V_{T3}) \tag{6}$$

Then, considering the electric potential $V_4$, which is the electric potential of the output terminal of the second source-follower circuit, which comprises the MOS·FET 8, the electric potential $V_4$ is given, like the case of the formula (3), as:

$$V_4 = V_3 - (V_{T4} + \Delta V_{T4}) \tag{7}$$

By substituting the right side of formula (6) for $V_3$ of formula (7), the potential $V_4$ is given as:

$$V_4 = \{V_2 + (V_{T3} + \Delta V_{T3})\} - (V_{T4} + \Delta T_{T4}) \tag{8}$$

Now, when the MOS·FET 6 and the MOS·FET 8 are produced on the same semiconductor substrate and by the same process, the threshold voltage potential $V_{T3}$ can be regarded equal to $V_{T4}$, and the variation $\Delta V_{T3}$ is regarded equal to the variation $\Delta V_{T4}$. Therefore, from the formula (8) and formula (5), the source electric potential $V_4$, namely, the output voltage $V_{out}$ is given as:

$$V_{out} = V_4 = V_2 = V_{in} \tag{9}$$

As is shown by the equation (9) the input voltage $V_{in}$ becomes equal to the output voltage $V_{out}$.

As has been explained above, by forming all the MOS·FETs of the impedance conversion circuit in FIG. 2 on the same semiconductor substrate by the same process method, the threshold voltages offset each other, and the variations also offset each other. Therefore, an output voltage $V_{out}$ of a level equal to the input voltage $V_{in}$ is obtainable. This means that even if the threshold voltage $V_T$ and/or variation $\Delta V_T$ of each MOS·FET vary, the output voltage $V_{out}$ is retained constant. Furthermore, as will be apparent to those skilled in the art, an impedance conversion circuit wherein the first and second FETs are constructed on a first semiconductor substrate and the third and fourth FETs are constructed on another semiconductor substrate will also result in equal input and output voltage levels.

Here, it is admitted that a depletion type MOS·FET may be used in lieu of the above-mentioned MOS·FET, wherein the same effect and operation were theoretically, as well as, empirically obtained.

FIG. 3 shows another embodiment of the impedance conversion circuit of the present invention. This circuit is composed by replacing the resistances 4, 7 and 9 of the circuit shown in FIG. 2, with the depletion type MOS·FET 10, 11 and 12, respectively. Using known modern integrated circuit technology, a person skilled in the art can easily integrate the enhancement type MOS·FETs 3, 5, 6 and 8, and the depletion type MOS·FET 10, 11 and 12 on the same semiconductor substrate. Here, in the impedance conversion circuit of FIG. 2 and FIG. 3, it is a matter of selections of design to adopt a P-channel type or an N-channel type as the conductivity type of channels of the MOS·FETs, and in either case they can be easily made. Further, it is obvious that any field effect transistors other than the MOS·FETs are usable, as long as they can be integrated, thereby realizing the same effect and operation as the above-mentioned embodiments of the present invention.

In accordance with the impedance conversion circuit of the present invention, as has been described above, referring to the foregoing embodiments the same voltage level can be obtained from the output terminal as any input signal voltage level, regardless of the threshold voltages of the FETs, and the impedance conversion is obtainable from a high input impedance to a low output impedance. Thereby the present invention can manifest a large advantage in signal transmission systems.

What is claimed is:

1. An impedance conversion circuit comprising:
    a first source-follower circuit comprising a first FET, the gate electrode being for receiving an input signal, a first load resistance connected between the source electrode of said first FET and ground, the drain electrode being directly connected to a power source terminal, and an output terminal provided between said load resistance and the source electrode of said first FET,
    a second FET connected by the source electrode to the output terminal of said first source-follower circuit, a first common connected point being made by connecting the gate electrode and the drain electrode of said second FET,
    a third FET connected by the source electrode to said first common connected point, a second common connected point being formed by connecting the gate electrode and the drain electrode of said third FET,
    a second load resistance connected between said power source terminal and the drain electrode of said third FET,
    a second source-follower circuit comprising a fourth FET and a third load resistance, the fourth FET being connected by the gate electrode to said second common connected point, the source electrode being connected to ground through said third load resistance, and the drain electrode being directly connected to said power source terminal, the second source-follower circuit being used for issuing an output signal therefrom.

2. An impedance conversion circuit in accordance with claim 1, wherein
    said first, second, third and fourth FETs are MOS·FETs which are constructed on a single semiconductor substrate.

3. An impedance conversion circuit in accordance with claim 1, wherein
    each of said FETs is formed as an enhancement MOS·FET.

4. An impedance conversion circuit in accordance with claim 1, wherein
    said load resistances connected respectively to said first, third and fourth FET are formed as MOS FETs.

5. An impedance conversion circuit in accordance with claim 4, wherein
    each of said load resistances is formed with depletion MOS·FET.

6. An impedance conversion circuit in accordance with claim 1, wherein
    said first FET and said second FET are constructed on a semiconductor substrate, and said third FET and said fourth FET are constructed on another semiconductor base.

7. An impedance conversion circuit in accordance with claim 1, wherein
    all of said FETs are constructed on the same semiconductor substrate.

* * * * *